(12) United States Patent
Sosio et al.

(10) Patent No.: US 9,136,853 B2
(45) Date of Patent: *Sep. 15, 2015

(54) ANALOG TO DIGITAL CONVERTER WITH NOISE REDUCING FEEDBACK PATH

(71) Applicant: Marvell World Trade Ltd., St. Michael (BB)

(72) Inventors: Marco Sosio, Pavia (IT); Antonio Liscidini, Pavia (IT); Rinaldo Castello, Arcore (IT); Gabriele Gandolfi, Siziano (IT); Vittorio Colonna, S. Martino Siccomario (IT)

(73) Assignee: MARVELL WORLD TRADE LTD., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 14/077,898

(22) Filed: Nov. 12, 2013

(65) Prior Publication Data

US 2014/0062740 A1 Mar. 6, 2014

Related U.S. Application Data

(63) Continuation of application No. 13/310,587, filed on Dec. 2, 2011, now Pat. No. 8,581,762.

(60) Provisional application No. 61/419,625, filed on Dec. 3, 2010.

(51) Int. Cl.
*H03M 3/00* (2006.01)
*H03M 1/06* (2006.01)

(52) U.S. Cl.
CPC ............... *H03M 1/06* (2013.01); *H03M 3/344* (2013.01); *H03M 3/368* (2013.01); *H03M 3/424* (2013.01); *H03M 3/454* (2013.01); *H03M 3/456* (2013.01)

(58) Field of Classification Search
CPC ..... H03M 3/454; H03M 3/424; H03M 3/456; H03M 3/344; H03M 3/368; H03M 1/06
USPC ........................... 341/143, 155; 375/296, 297
See application file for complete search history.

(56) References Cited

U.S. PATENT DOCUMENTS 6,522,277 B2 * 2/2003 Fujimori et al. .............. 341/144
6,549,067 B1 4/2003 Kenington (Continued)

OTHER PUBLICATIONS

Bakkaloglu, Bert AN et al., "A 1.5-V Multi-Mode Quad-Band RF Receiver for GSM/EDGE/CDMA2K in 90-nm digital CMOS Process", IEEE Journal of Solid-Slate Circuits, vol. 41, No. 5, May 2006, pp. 1149-1159.
International Search Report and Written Opinion mailed Mar. 29, 2012 from International Application No. PCT/IB2011/003089 filed Dec. 2, 2011.
Naqvi, Syed R. et al., "Dynamic Calibration of Feedback DAC Non-Linearity for a 4th Order CT Sigma Delta for Digital hearing Aids", IEEE, Sep. 26, 2011, pp. 109-113.

(Continued)

*Primary Examiner* — Jean B Jeanglaude

(57) ABSTRACT

An analog to digital converter including a low pass filter element, a quantizer, and a digital to analog converter provide in a feedback path. The low pass filter element is configured to filter an analog input signal. The quantizer is configured to receive an analog output signal that is based on the filtered analog input signal and convert the analog output signal to a digital output signal. The digital to analog converter is configured to generate an analog feedback signal based on the digital output signal and selectively inject or absorb current associated with the feedback path to reduce noise associated with the digital to analog converter. The analog feedback signal is combined with the analog input signal at an input of the low pass filter element.

15 Claims, 10 Drawing Sheets

(56) References Cited

U.S. PATENT DOCUMENTS

| | | |
|---|---|---|
| 6,798,844 B2 | 9/2004 | Ratto |
| 6,930,624 B2 * | 8/2005 | Hezar et al. .................. 341/143 |
| 6,973,138 B1 | 12/2005 | Wright |
| 7,576,670 B2 * | 8/2009 | Clara et al. .................. 341/143 |
| 7,728,748 B1 * | 6/2010 | Kirichenko .................. 341/133 |
| 2008/0278360 A1 | 11/2008 | Koli |
| 2010/0073207 A1 * | 3/2010 | Gupta et al. .................. 341/120 |

OTHER PUBLICATIONS

Sosio M. et al., "A Complete DVB-T/ATSC Tuner Analog Base-Band Implemented with a Single Filtering ADC", 2011 IEEE, Sep. 12, 2011, pp. 391-394.

Straayer, M.Z. et al., "A 12-bil, 10-MHz Bandwidth, Continous-Time ADC With a 5-Bil, 950-MS/s VCO-Based D Quantizer", IEEE Journal of Solid-Slate Circuits, vol. 43, No. 4., Apr. 2008, pp. 805-814.

* cited by examiner

ANALOG TO DIGITAL CONVERTER WITH NOISE REDUCING FEEDBACK PATH

CROSS-REFERENCE TO RELATED APPLICATIONS

The present disclosure is a continuation of U.S. patent application Ser. No. 13/310,587 (now U.S. Pat. No. 8,581, 762), filed on Dec. 2, 2011, which claims the benefit of U.S. Provisional Application No. 61/419,625, filed on Dec. 3, 2010. The entire disclosures of the applications referenced above are incorporated herein by reference.

BACKGROUND

The present disclosure relates to analog circuits and in particular to analog to digital conversion circuitry.

Unless otherwise indicated herein, the approaches described in this section are not prior art to the claims in this application and are not admitted to be prior art by inclusion in this section.

A software-defined radio (SDR) system is a radio communication system where components that have been typically implemented in hardware (e.g., mixers, filters, amplifiers, modulators/demodulators, detectors, etc.) are reconfigurable by means of software. A basic SDR system typically comprises an antenna connected to a radio frequency (RF) front-end. An output of the RF front-end may then feed into a computing device (e.g., personal computer, mobile device, etc.).

Receiver front-ends typically use a variable-frequency oscillator and mixer to tune the desired signal to a common intermediate frequency or baseband, where it is processed by an analog filter and sampled by an analog-to-digital converter (ADC). Typical ADC's lack the dynamic range to pick up low-power radio signals. Accordingly, a low-noise amplifier (LNA) is typically provided upstream of the ADC and before the mixer. If spurious signals are present at the antenna (which is typical), these compete with the desired signals. They may introduce distortion in the desired signals, or may block them completely. A common solution is to put a band-pass filter between the antenna and the amplifier. The path for SDR designs involves the reduction of the base-band analog section of the wireless receiver in favor of a more flexible digital one.

SUMMARY

In some embodiments, a circuit includes a current low pass filter connected to receive an incoming signal. The low pass filter may be connected to an integrator. A quantizer receives an output of the integrator to produce a digital signal as an output of the circuit. A feedback path comprising a digital to analog converter (DAC) is connected between the output of the quantizer and an input of the integrator. In an embodiment, the DAC in the feedback path may be a Class B DAC.

In some embodiments, the integrator comprises an op-amp. The integrator includes a capacitive feedback path between an output of the op-amp and its input.

In some embodiments, the quantizer block is an analog to digital converter (ADC). In an embodiment, the ADC may be a Flash ADC or a sigma-delta ADC.

In an embodiment, the quantizer block comprises a multi-feedback second order sigma-delta modulator. The multi-feedback second order sigma-delta modulator may include a quantizer element in cascade with a first integrator and a second integrator.

The following detailed description and accompanying drawings provide a better understanding of the nature and advantages of the present disclosure.

DESCRIPTION

In the following description, for purposes of explanation, numerous examples and specific details are set forth in order to provide a thorough understanding of the present disclosure. It will be evident, however, to one skilled in the art that the present disclosure as defined by the claims may include some or all of the features in these examples alone or in combination with other features described below, and may further include modifications and equivalents of the features and concepts described herein.

Embodiments of an analog to digital converter (ADC) in accordance with the principles of the present disclosure may be employed in the baseband analog section of a wireless receiver. For example, the baseband analog section in a software defined radio (SDR) can realize a reduction in components and power consumption, along with a reduced "footprint." Moving the ADC functionality closer to the antenna can improve noise performance as well.

Figure 1:
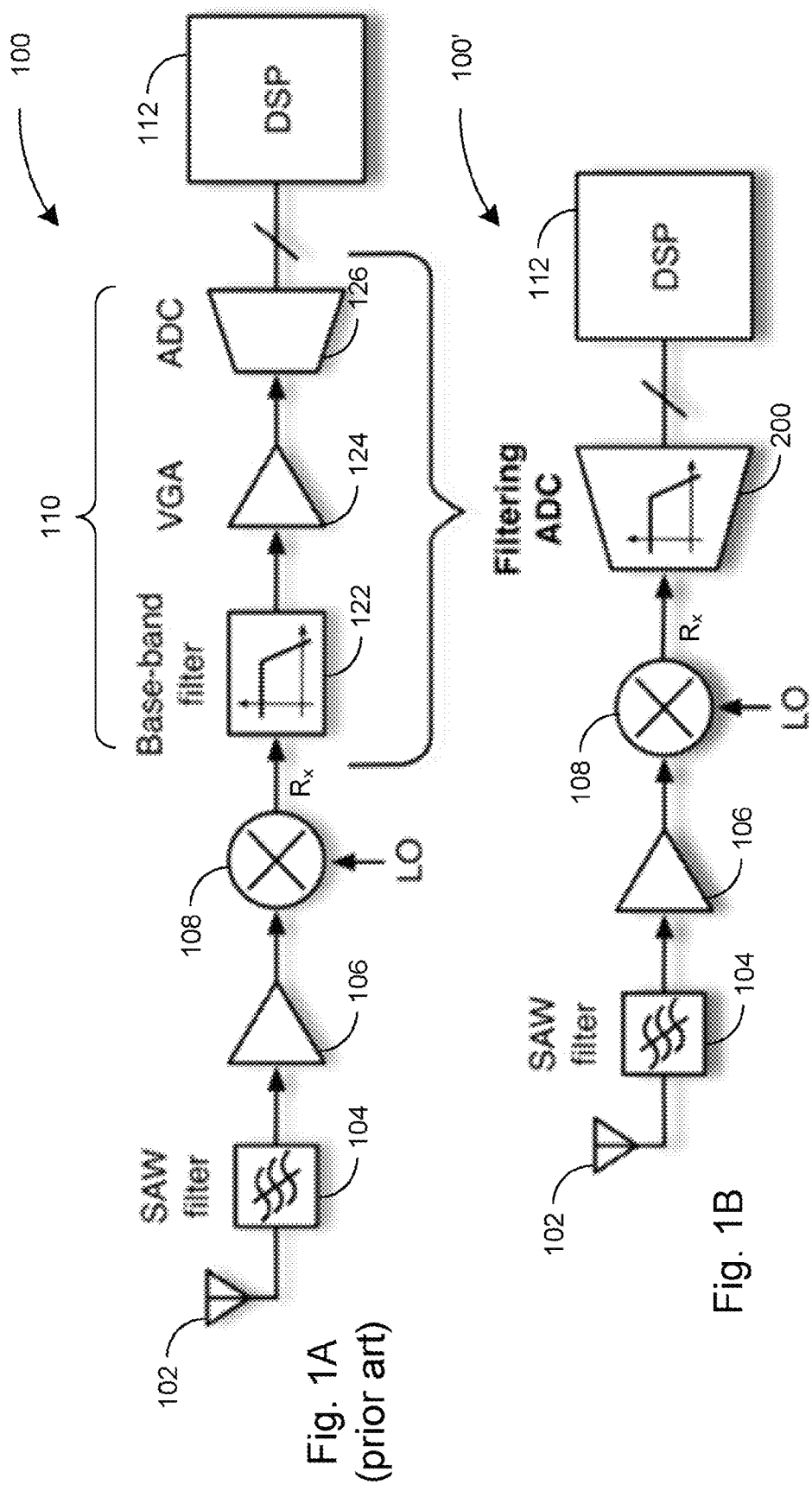
FIG. 1A shows a conventional RF front-end configuration.
FIG. 1B shows an RF front-end circuit in accordance with aspects of the present disclosure.

Referring to FIG. 1A, a high level block diagram illustrates a conventional receiver section of a wireless receiver device, such as an SDR 100, comprising an antenna 102, a surface acoustic wave (SAW) filter 104, a low noise amplifier (LNA) 106, a down converting mixer 108 (receiving a reference from a local oscillator (LO)), an analog baseband section 110, and a digital signal processing (DSP) 112. In the case of an SDR, the DSP 112 can be configured to provide the functions of a radio. More generally, however, the DSP 112 can be configured for other kinds of wireless receivers.

FIG. 1A shows that a conventional baseband section 110 may comprise a baseband filter 122, a variable gain amplifier (VGA) 124, and an ADC 126. In some embodiments according to the present disclosure, the components of the baseband section 110 may be replaced with an ADC component 200 (a "filtering ADC"), as illustrated by the SDR 100' shown in FIG. 1B.

Figure 2:
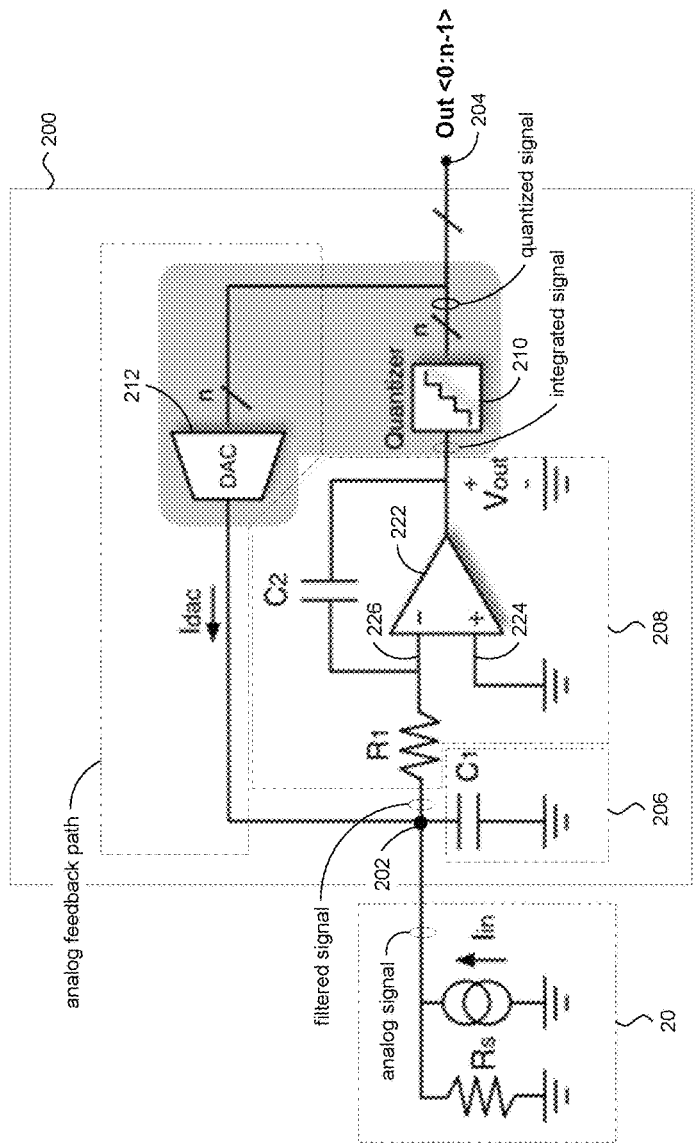
FIG. 2 illustrates details of an embodiment of a filtering ADC in accordance with the present disclosure.

Referring to FIG. 2, an analog to digital converter (ADC) circuit 200 in accordance with the disclosed embodiments may receive an analog input signal from a signal source 20. The signal source 20 may be represented by an equivalent circuit having an output resistance Rs and a source of input current Iin. For example, with respect to FIG. 1A, the signal source 20 may model the down converting mixer 108. The input current Iin corresponds to a down converted receive signal Rx produced by the down converting mixer 108, while Rs models the finite output resistance of the down converting mixer.

In some embodiments, the ADC circuit 200 includes an input 202 for receiving the analog signal and an output 204 for outputting a digital output signal. The ADC circuit 200 includes a low pass filtering component 206 to produce a filtered signal from the received analog signal. In an embodiment, the low pass filtering component 206 comprises a capacitor C1.

An integrator 208 is connected to the filtered signal from the low pass filtering component 206. In some embodiments, the integrator 208 comprises an operational amplifier (op-amp) 222, a capacitor C2, and a resistor R1, configured as an integrator circuit to generate an integrated signal Vout. A non-inverting input 224 of the op-amp 222 is connected to ground potential. The integrated signal Vout feeds back to an inverting input 226 of the op-amp 222 via the capacitor C2. The filtered signal is connected to the inverting input 226 via the resistor R1.

A quantizer block 210 is connected to receive the integrated signal from the integrator 208 and can generate a quantized signal comprising n-bit words. In some embodiments, the quantizer block 210 comprises a Flash analog to digital converter (ADC), having n bits of resolution. In other embodiments, the quantizer block 210 may be provided by any suitable sigma-delta ADC design, and more generally any ADC design may be employed. In some embodiments, the quantized signal output by the quantizer block 210 may be coupled to the output 204 as an n-bit digital output signal of the ADC circuit 200.

An analog feedback path between the output 204 of the ADC circuit 200 and the input 202 includes an n-bit resolution digital to analog converter (DAC) 212. The n-bit quantized signal from the quantizer block 210 is fed into the DAC 212. An analog feedback signal, namely current Idac generated by the DAC 212, is combined with the analog input signal at the input 202.

As will be explained in further detail, the ADC circuit 200 provides low pass filtering of a continuous analog input to filter interferers (e.g., spurious signals) while at the same time outputting a digital signal. The ADC circuit 200 in accordance with principles of the present disclosure reduces the baseband analog section 110 (FIG. 1), and exhibits various characteristics, including:

The capacitance C1 absorbs a portion of the out-of-band interferers coming from the mixer. For example, driving the ADC circuit 200 with a current signal instead of a voltage signal allows the capacitance C1 to filter out the out-of-band interferers. Such passive filtering improves the dynamic range of the circuit 200 without requiring an increase in power consumption.

Both the analog and the quantization noise are high-pass shaped.

In an embodiment, the DAC 212 may be a Class B DAC to realize low noise performance in the feedback path. Such low noise characteristic is significant when processing small signal levels.

A. Transfer Function, Dynamic Range, and Capacitance C1

Figure 3:
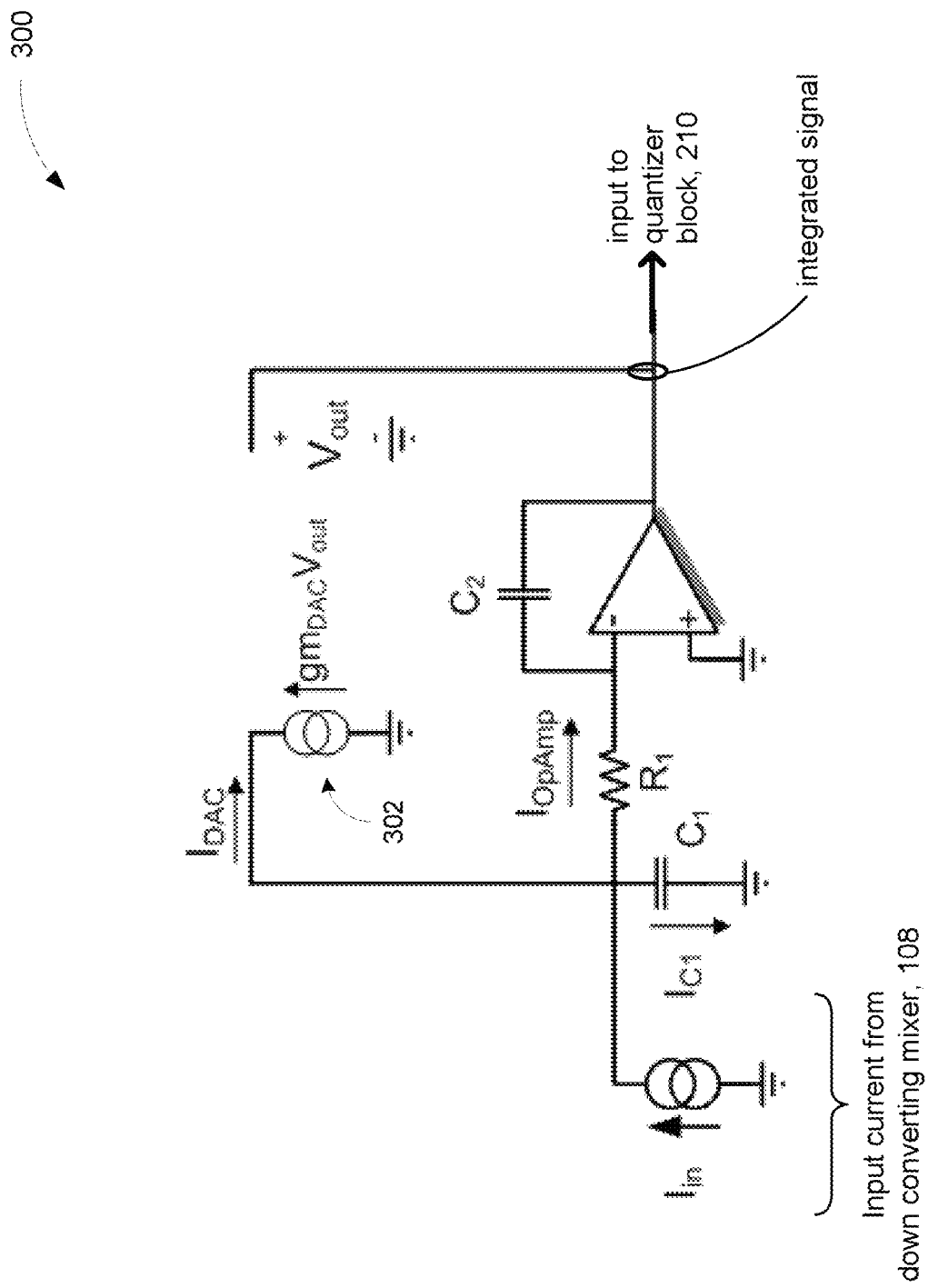
FIG. 3 is a small signal model of the filtering ADC shown in FIG. 2.

The transfer function $$\frac{V_{out}}{I_{in}}$$

of the ADC circuit 200 shown in FIG. 2 is analyzed in the continuous-time domain using the model 300 shown in FIG. 3. In the model 300, the cascade arrangement of the quantizer block 210 and the DAC 212 is represented as a transconductor 302 having a transconductance $gm_{DAC}$. The value of the transconductance $gm_{DAC}$ is set as a ratio of the maximum current that the DAC 212 has to handle to the maximum allowed voltage swing at the input of the quantizer block 210 (namely, the integrated signal $V_{out}$):

$$gm_{DAC} = \frac{\text{Max } DAC \text{ current}}{\text{Max voltage swing}}.$$

The ADC circuit 200 realizes a $2^{nd}$ order low pass filter whose transfer function is given as:

$$H(s) = \frac{V_{out}}{I_{in}} \qquad \text{Eqn. 1}$$
$$= \frac{G}{1 + \frac{s}{\omega_0 Q} + \frac{s^2}{\omega_0^2}},$$

where G is a transimpedance gain equal to $$\frac{1}{gm_{DAC}}$$

and ω and Q are defined by:

$$\omega_0 = \sqrt{\frac{gm_{DAC}}{R_1 C_1 C_2}}, \qquad \text{Eqn. 2}$$

and $$Q = \sqrt{gm_{DAC} R_1} \sqrt{\frac{C_1}{C_2}} \times \frac{1}{\left(1 + \frac{R_1}{R_S}\right)}. \qquad \text{Eqn. 3}$$

The second order filter represented in Eqn. 1 is embedded in the ADC circuit 200. This increases its dynamic range since the quantizer block 210 handles out-of-band interferers that are smaller than the ones present at the input of the ADC circuit 200. Eqn. 1 provides the ADC circuit 200 transfer function. With respect to out-of-band signals, H(s) decreases as the frequency of the signal increases. Accordingly, the dynamic range increases as the inverse of Eqn. 1, namely 1/H(s). In other words, the dynamic range increases as H(s) decreases. Hence, the increase in dynamic range is proportional to the attenuation provided by the filtering behavior of the ADC circuit 200, and thus is frequency dependent.

Figure 4:
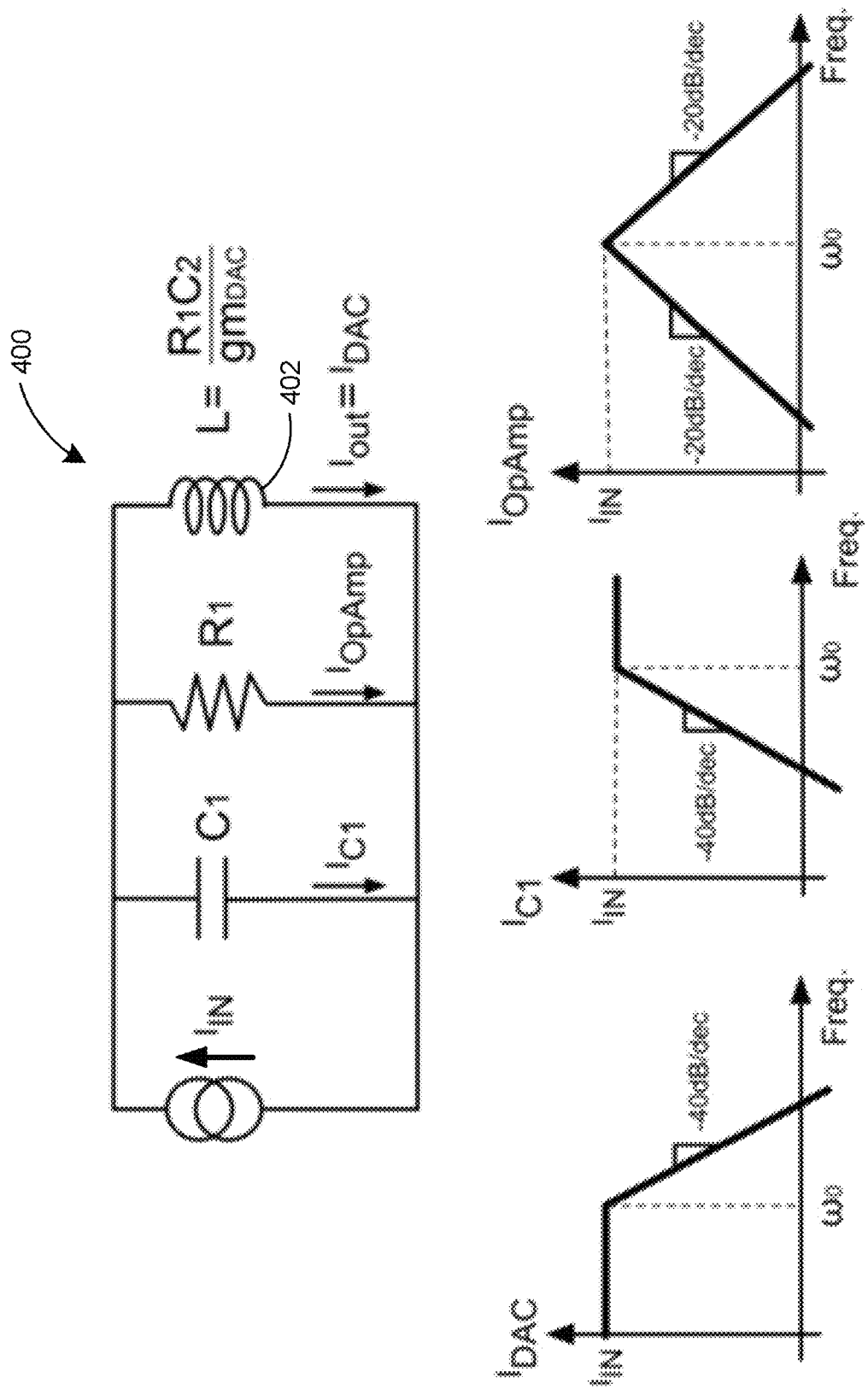
FIG. 4 represents an equivalent RLC model of the filtering ADC shown in FIG. 2.

The filter that is embedded in the ADC circuit 200 (FIG. 2) can be modeled using an RLC shunt network 400 shown in FIG. 4. The input current $I_{in}$ represents the input current from the down converting mixer 108. $R_1$ and $C_1$ of the ADC circuit 200 are represented directly in the model, while the DAC 212 is modeled by an inductive element 402. The integrated signal $V_{out}$ is represented as current flowing into the inductive element 402. The inductance L of the inductive element 402 is equal to $$\frac{R_1 C_2}{gm_{DAC}}.$$

It will be appreciated that by Eqn. 3 can be rewritten as:

$$Q = \frac{w_0 C_1 R_1 R_s}{R_1 + R_s} \quad \text{Eqn. 3A}$$

where $w_0$ is shown by Eqn. 2. Typically, $w_0$, $C_1$ and $R_s$ are chosen for a given design, and so, as can be seen by Eqn. 3A, the resistor $R_1$ sets the quality factor of the synthesized complex poles in the resulting design.

The input current $I_{in}$ is split into three different components. A current component $I_{C1}$ flows through the capacitive element $C_1$, a current component $I_{OpAmp}$ flows through the resistive element $R_1$, and a current component $I_{DAC}$ flows through the inductive element 402. The RLC shunt network is useful for evaluating the current transfer (CT) functions between the input current $I_{in}$ and the component current flows $I_{C1}$, $I_{OpAmp}$, and $I_{DAC}$. The current transfer functions are represented by the three plots shown in FIG. 4. In a wireless receiver, most of the energy is located outside of the band of interest. Accordingly, the filtering provided by $C_1$ drastically reduces the amount of current that active components, such as DAC 212 and op-amp 222, must handle, thus reducing the power requirements of the active devices. Moreover, since the filtering that is achieved by $C_1$ is passive, there is no additional power requirement for the filtering. The CT function of the DAC 212 exhibits a $2^{nd}$ order low-pass behavior. The CT function for the op-amp 222 shows that the op-amp draws the maximum amount of signal current at the resonance frequency, while beyond that the op-amp exhibits $1^{st}$ order low-pass filtering.

B. Analog and Quantization Noise Shaping

The amount of filtering that is provided by the ADC circuit 200 sets the maximum out of band signal that can be handled by the ADC. The minimum signal level that can be handled by the ADC circuit 200 is established by the noise floor of the ADC, which is determined based on a analog noise component and a quantization noise component.

1. Analog Noise

The main analog noise contributors in the ADC circuit 200 in FIG. 2 are the resistor $R_1$, the op-amp 222, and the feedback DAC 212. Since the DAC 212 injects its noise directly at the input node 226 of the op-amp 222, its noise transfer function is equal to the filter signal transfer function given by Eqn. 1 above. For the resistor $R_1$ and the op-amp 222, the transfer functions may be evaluated using the model discussed above, to obtain the following transfer functions based on Eqn. 1:

$$H_{N,R1}(s) = H(s) \cdot \left(\frac{1}{R_1} + sC_1\right) \quad \text{Eqn. 4}$$

-continued $$H_{N,OA}(s) = H(s) \cdot \left(\frac{1}{R_s} + sC_1 + sC_2\left(1 + \frac{R_1}{R_s}\right) + s^2 C_1 C_2 R_1\right) \quad \text{Eqn. 5}$$

Figure 5:
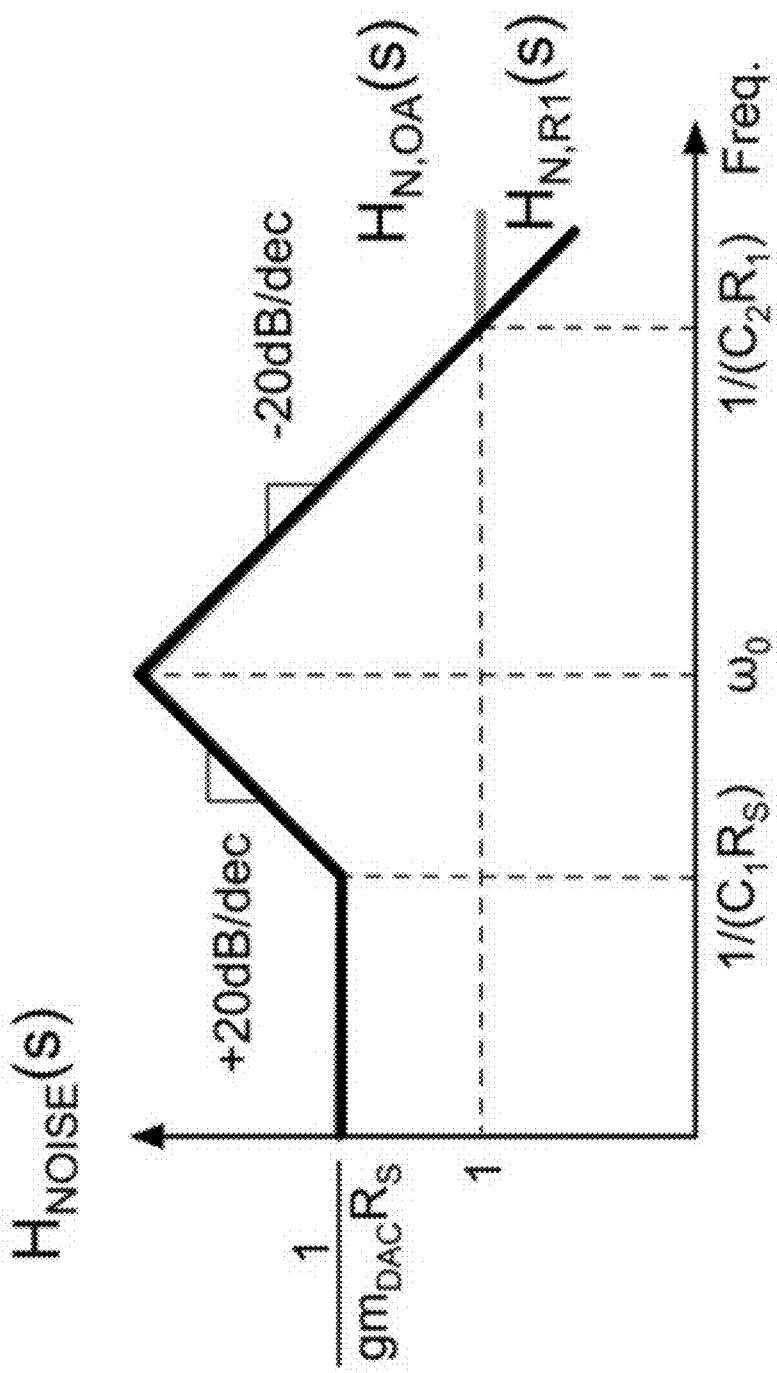
FIG. 5 is a transfer function of the filtering ADC shown in FIG. 2, illustrating that the analog and quantization noise are high-pass shaped.

The transfer functions of Eqns. 4 and 5 show a high-pass shape due to the presence of in band zeros (ideally located at DC). This is illustrated by the plot shown in FIG. 5. The high-pass shaping of the analog noise is an intrinsic mechanism of current-driven filters that reduces the integrated in-band noise.

The high-pass shaping of the analog noise is less evident when the driving impedance $R_s$ of the signal source 20 in FIG. 2 is decreased. For a given channel bandwidth, a trade-off between noise shaping and frequency selectivity occurs. In fact, a higher filter cut-off frequency decreases the in-band noise, but at the same time diminishes the out-of-band blockers attenuation. Under the assumption of a driving impedance, where $R_s \gg 1/(C_1 \omega_0)$ and $C_1 \gg C_2$, the total integrated in-band noise at the input of the quantizer is given by $$\overline{V_{OUT,NOISE}^2} = 4kT \frac{1}{gm_{DAC}^2} \left(gm_{EQ,DAC} f_B + \frac{2\pi}{3} C_1 \left(\frac{Q}{f_0} + 2\pi C_1 R_{EQ}\right) f_B^3\right), \quad \text{Eqn. 6}$$

where k is the Boltzmann constant,
T is absolute temperature,
$R_{EQ}$ is the input equivalent noise resistance of op-amp 222,
$gm_{EQ,DAC}$ is the equivalent noise transconductance of DAC 212,
$f_0$ is the cut-off frequency, and
$f_B$ is the channel bandwidth.

The overall noise can be reduced by reducing the input capacitance $C_1$, which would also reduce silicon area. However, a reduction of the capacitance $C_1$ causes an increase in the input impedance of the ADC circuit 200, leading to higher voltage swings that can deteriorate the linearity of the DAC 212 and mixer 108.

2. Quantization Noise

The filtering ADC circuit 200 has an advantage in terms of quantization noise compared to the conventional cascade configuration of a filter 122 and an ADC 126 as shown in FIG. 1A. In fact, the loop gain used to synthesize the complex poles in the ADC circuit 200 also contributes to quantization noise shaping. Quantization noise shaping is an intrinsic mechanism of Sigma-Delta ADC converters. In a Sigma-Delta converter "quantization noise" can be canceled at low frequency. The quantization noise transfer function (QNTF) for the ADC circuit 200 in FIG. 2 has been evaluated with a linear model leading to the following result:

$$QNTF(s) = \frac{sC_2(1 + sC_1 R_1)}{s^2 C_1 C_2 R_1 + sC_2 + gm_{DAC}} \quad \text{Eqn. 7}$$

Figure 6:
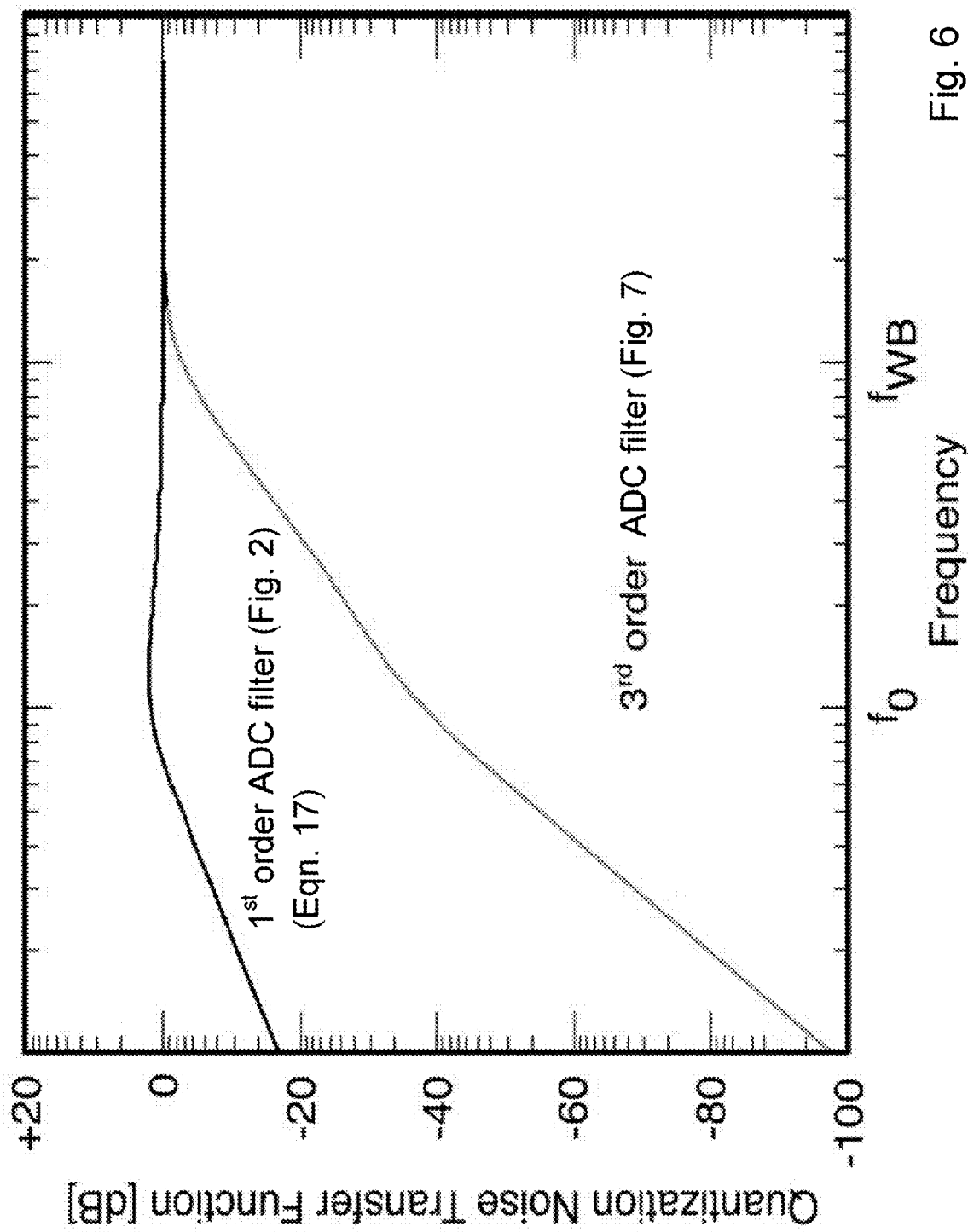
FIG. 6 plots quantization noise as a function of frequency for two embodiments of a filtering ADC in accordance with principles of the present disclosure.

The zeroes in Eqn. 7 are the open loop poles of the ADC circuit 200, namely one at DC due to the integrator $C_2$ and one at $1/(C_1 R_1)$, while the poles are those of the closed loop transfer function given by Eqn. 1. A plot of Eqn. 7 is illustrated in FIG. 6. The presence of the zero at DC leads to a first order noise shaping that peaks at $w_0$, where QNTF is equal to $\sqrt{1+Q^2}$, with Q given by Eqn. 3. The QNTF shown in FIG. 6, therefore, confirms this "noise shaping" effect of the ADC circuit 200. The QNTF is below 0 dB in-band (so noise is reduced at low frequency), and equal to 0 dB out-of-band (so noise is not reduced at high frequency). Quantization noise shaping increases the resolution of the ADC circuit 200.

However, first order noise shaping may not provide adequate dynamic range for some applications. For example, in a software defined radio (SDR), first order noise shaping may not be able to provide adequate dynamic range. Therefore, in order to attain the dynamic range required by an SDR, a quantizer 210 having an impractically large number of levels may be required.

Figure 7:
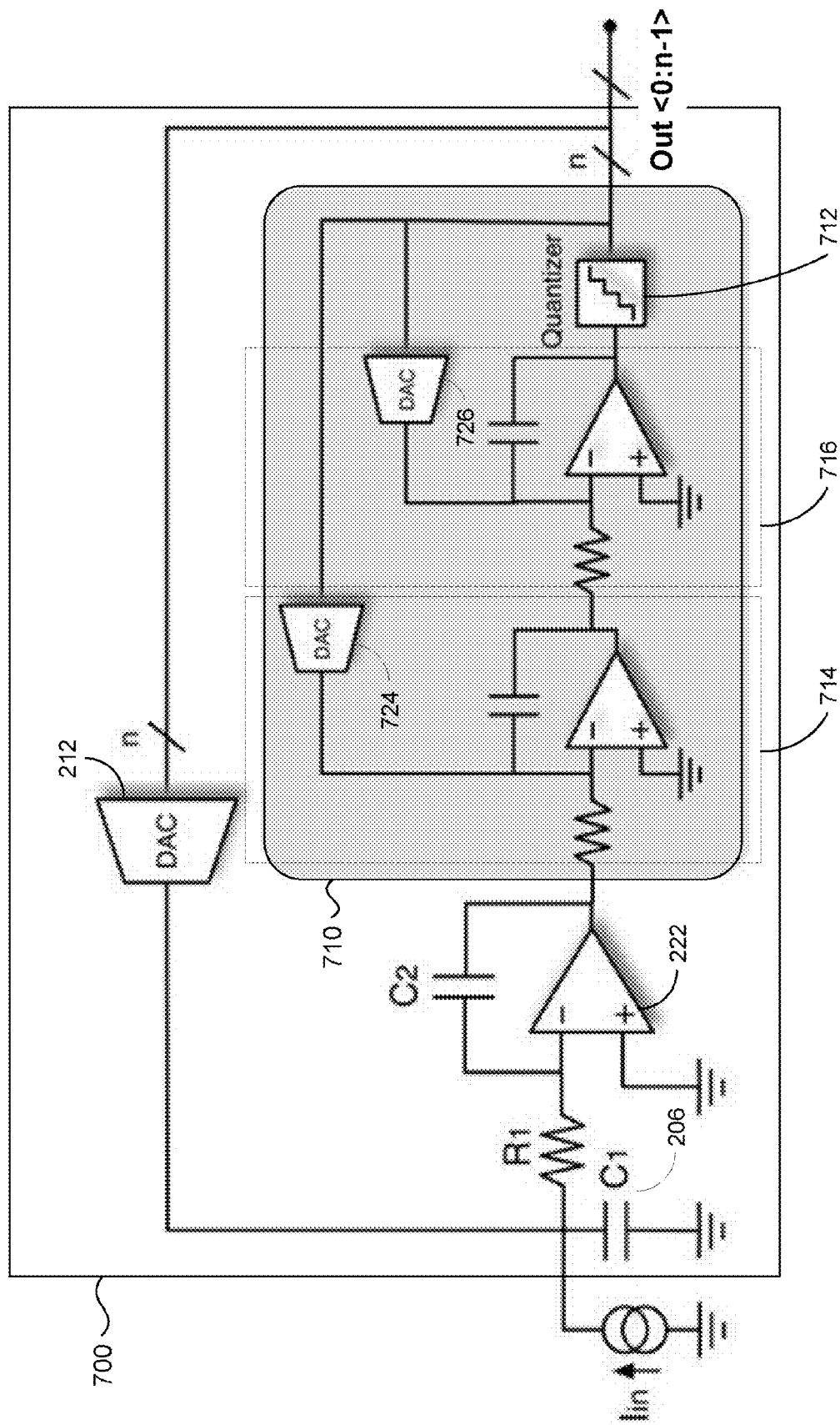
FIG. 7 illustrates details on an embodiment of a filtering ADC in accordance with the present disclosure.

Accordingly, in some embodiments, to increase the order of the quantization noise shaping without compromising the frequency selectivity of the ADC circuit 200, the quantizer 210 may be replaced by a wide-band multi-feedback $2^{nd}$ order $\Sigma\Delta$ modulator. As shown in FIG. 7, the resulting configuration is a $3^{rd}$ order filtering ADC 700 in accordance with principles of the present disclosure. The multi-feedback modulator 710 replaces the quantizer 210 in the configuration shown in FIG. 2. In an embodiment the multi-feedback $2^{nd}$ order $\Sigma\Delta$ modulator 710 comprises a quantizer 712 in cascade with two integrators 714 and 716. Integrator 714 includes a feedback path via a DAC 724 from the output of the multi-feedback $2^{nd}$ order $\Sigma\Delta$ modulator 710. Integrator 716 includes a feedback path via a DAC 726 from the output of the multi-feedback $2^{nd}$ order $\Sigma\Delta$ modulator 710.

Assuming that the additional poles introduced by the multi-feedback modulator 710 are placed sufficiently far from that of the filtering component 206 and that the DC gain of the multi-feedback modulator 710 is equal to 1, the ADC 700 as a whole still implements the filtering function given by Eqn. 1. However, from the point of view of quantization noise shaping, the embodiment shown in FIG. 7 increases the amount of in-band compression due to the two additional DC-poles associated with the extra two integrators 714 and 716. Thus, referring again to FIG. 6, a plot of the QNTF for the configuration shown in FIG. 7 is compared with the QNTF of the ADC circuit 200. As can be expected with the presence of two additional poles, the pass-band of the QNTF for ADC 700 has a 60 dB/dec slope as compared to the 20 dB/dec slope for the single pole ADC circuit 200.

Figure 8:
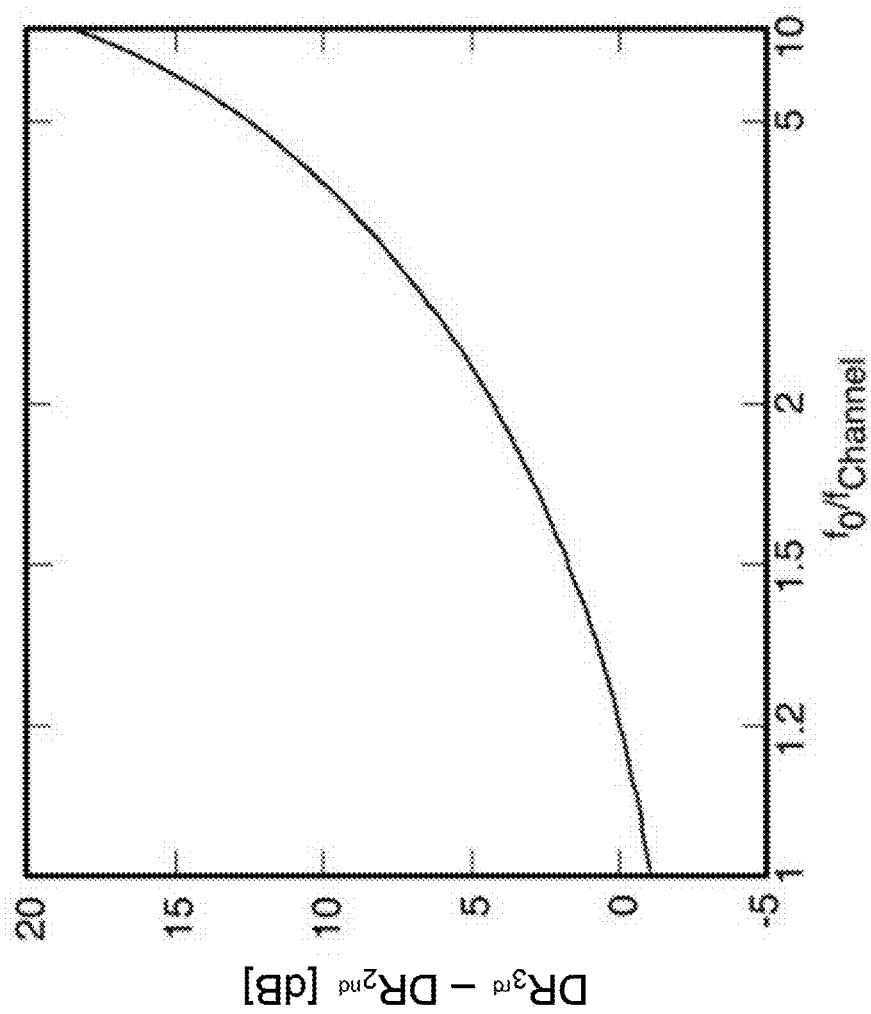
FIG. 8 illustrates an improvement provided by the filtering ADC of FIG. 7 over the filtering ADC of FIG. 2.

Referring to FIG. 8, the amount of additional noise shaping provided by the third order solution shown in FIG. 7 has been compared with a traditional second order $\Sigma\Delta$ modulator. The graph in FIG. 8 shows the difference between the quantization noise integrated in the signal bandwidth of the third order solution (shown in FIG. 7) and the quantization noise integrated in the signal bandwidth of a traditional second order modulator, versus filtering cut off frequency. This difference is expressed in terms of dynamic range (DR), for a given clock frequency. Dynamic range information provides quantization noise information and vice-versa. As can be seen, the further away the filter bandwidth $f_0$ is placed from the channel bandwidth $f_{Channel}$ the greater is the noise shaping effect as compared to the traditional solution. The slight degradation in the integrated noise when the filter bandwidth coincides with the channel bandwidth (i.e., where $f_0/f_{Channel}=1$) is due to the chosen filter Q.

C. Noise Reduction with Class-B DAC

Figure 9:
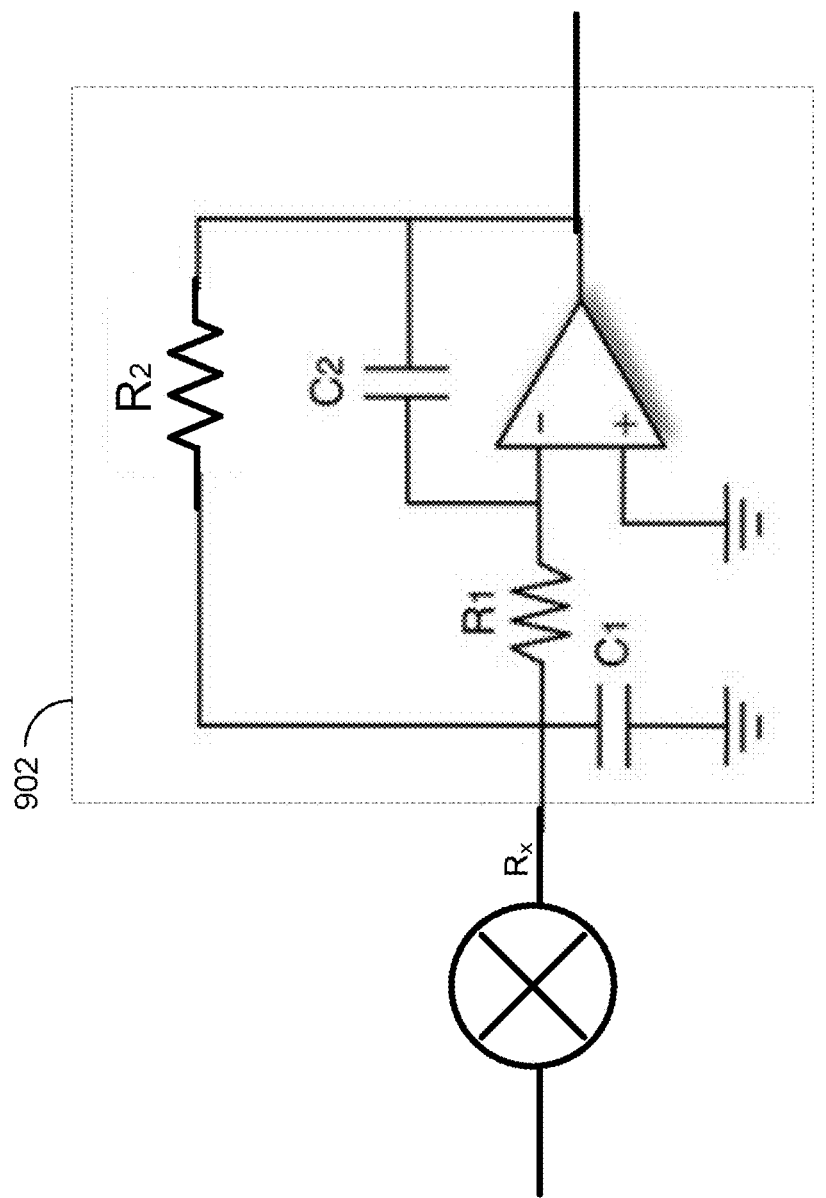
FIG. 9 represents a conventional Rauch filter.

In conventional active-RC filters, the overall noise is roughly defined by the total capacitance used (sometimes referred to as the kT/C law). This noise arises from the resistors used to synthesize the poles and depends only on the resistor values and operating temperature in addition to the filter order and Q. For example, in a traditional Rauch biquad filter 902 (FIG. 9), the feedback resistor $R_2$ injects at the input of the filter a current noise spectral density given by:

$$i_{noise,R}^2 = 4\,kTg, \quad \text{Eqn. 8}$$

where g is the conductance of resistor $R_2$. The thermal noise is independent of the input signal amplitude and flows to the output following the signal transfer function of the Rauch biquad filter.

Referring to the filtering ADC circuit 200 of FIG. 2, the DAC 212 in the feedback path injects rectangular pulses of current that are controlled by the output of the quantizer 210. In an embodiment, referring to FIG. 10, a Class-B DAC topology is shown which can reduce the noise added by the DAC. The noise added by a Class-B DAC depends on the output code and it is possible to minimize it in the absence of large interferer (i.e., when the sensitivity required to the receiver is maximum).

Figure 10:
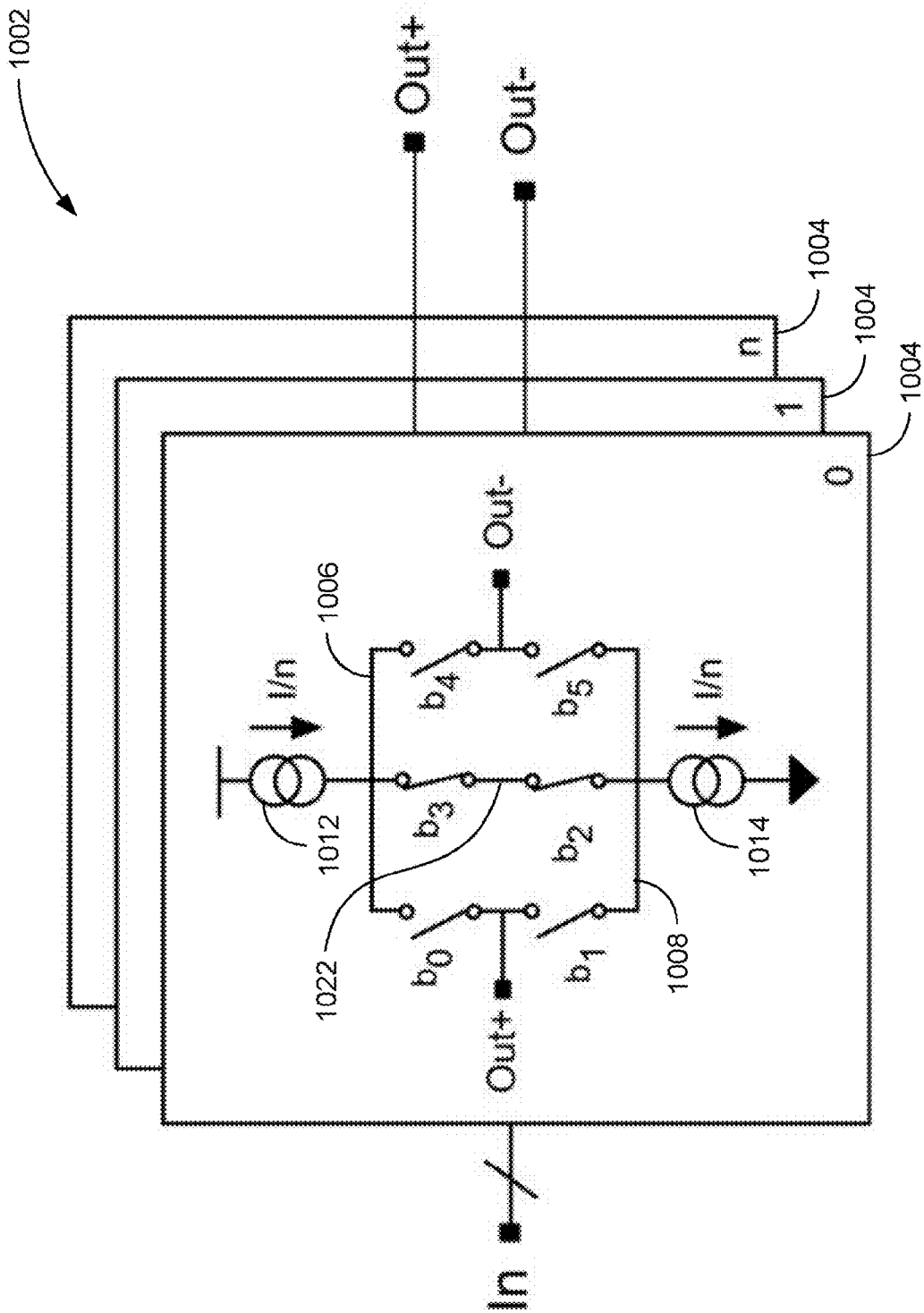
FIG. 10 shows a Class B DAC that can be substituted in an embodiment of the filtering ADC.

The DAC 1002 shown in FIG. 10 is a push-pull structure that comprises multiple cells 1004. The DAC 1002 injects or absorbs current without requiring any fixed bias to be connected directly to the output. In each cell 1004, four switches (b0, b1, b4, b5) lead current (drawn from the positive rail 1006 or negative rail 1008) to the positive or negative output (Out+, Out−). Switches b2 and b3 are connected to a fixed node 1022 to allow the cell 1004 to be switched OFF while maintaining the current generators 1012 and 1014 in the ON state.

Each cell 1004 can pull and push the signal current and also be set in a rest condition. When the input signal (In) decreases, less feedback signal is required and fewer cells 1004 are excited. In the presence of small signal, it can be assumed that feedback works only for few clock times (codes near the middle one). When the input signal goes to zero, the noise injected by the DAC 1002 is substantially zero.

It is possible to demonstrate, starting from the previous considerations, that the current noise spectral density $i_{noise,B-DAC}^2$ injected by the Class-B DAC 1002 at the input of the filtering ADC circuit 200 (FIG. 2) is proportional to the amount of feedback signal and is on average given by:

$$i_{noise,B-DAC}^2 = 4kT\gamma g_{mDac} \cdot \left(2\frac{V_{QUANT}}{V_{OV}}\right), \quad \text{Eqn. 9}$$

where $V_{QUANT}$ is the signal voltage at the input of the quantizer 210, and $V_{OV}$ is the overdrive of the current generators 1012 and 1014 in each cell 1004. Eqn. 9 describes the noise injected by a class-B DAC. The equation shows that class-B DAC noise depends on $V_{QUANT}$ (which in turn depends on the input analog signal of the filtering ADC). In particular, a low $V_{QUANT}$ amplitude provides low noise.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present disclosure along with examples of how aspects of the present disclosure may be implemented. The above examples and embodiments should not be deemed to be the only embodiments, and are presented to illustrate the flexibility and advantages of the present disclosure as defined by the following claims. Based on the above disclosure and the following claims, other arrangements, embodiments, implementations and equivalents will be evident to those skilled in the art and may be employed without departing from the spirit and scope of the disclosure as defined by the claims.

What is claimed is:

1. An analog to digital converter, comprising:
   a low pass filter element configured to filter an analog input signal;
   a quantizer configured to (i) receive an analog output signal that is based on the filtered analog input signal, and (ii) convert the analog output signal to a digital output signal; and
   a digital to analog converter configured to generate an analog feedback signal based on the digital output signal, wherein (i) the digital to analog converter is provided in a feedback path between an output of the quantizer and an input of the quantizer, (ii) the digital to analog converter is configured to selectively inject and absorb current associated with the feedback path in an amount proportional to a voltage at the input of the quantizer to reduce noise injected by the digital to analog converter, and (iii) the analog feedback signal is combined with the analog input signal at an input of the low pass filter element.

2. A method of operating an analog to digital converter, the method comprising:
   low-pass filtering an analog input signal;
   generating an analog output signal based on the filtered analog input signal;
   converting, using a quantizer, the analog output signal to a digital output signal;
   using a digital to analog converter arranged in a feedback path between an output of the quantizer and an input of the quantizer, generating an analog feedback signal based on the digital output signal;
   selectively injecting and absorbing current associated with the feedback path in an amount proportional to a voltage at the input of the quantizer to reduce noise injected by the digital to analog converter into the analog feedback signal; and
   combining the analog feedback signal with the analog input signal.

3. A method of operating a digital to analog converter, the method comprising:
   low-pass filtering an analog input signal;
   generating an analog output signal based on the filtered analog input signal;
   converting, using a quantizer, the analog output signal to a digital output signal;
   using a digital to analog converter arranged in a feedback path between an output of the quantizer and an input of the quantizer, generating an analog feedback signal based on the digital output signal;
   selectively injecting or absorbing current associated with the feedback path to reduce noise associated with generating the analog feedback signal; and
   combining the analog feedback signal with the analog input signal,
   wherein a transconductance of the quantizer and the digital to analog converter corresponds to a ratio of (i) a maximum current input to the digital to analog converter to (ii) a maximum voltage swing at an input of the quantizer.

4. The method of claim 3, wherein the noise associated with the feedback path is proportional to a voltage of the analog output signal.

5. The method of claim 3, further comprising attenuating frequencies of the analog input signal that are greater than a predetermined frequency.

6. The method of claim 3, wherein the quantizer comprises a multi-feedback second order sigma-delta modulator.

7. An analog to digital converter, comprising:
   a low pass filter element configured to filter an analog input signal;
   a quantizer configured to (i) receive an analog output signal that is based on the filtered analog input signal, and (ii) convert the analog output signal to a digital output signal; and
   a digital to analog converter configured to generate an analog feedback signal based on the digital output signal, wherein (i) the digital to analog converter is provided in a feedback path between an output of the quantizer and an input of the quantizer, (ii) the digital to analog converter is configured to selectively inject or absorb current associated with the feedback path to reduce noise associated with the digital to analog converter, and (iii) the analog feedback signal is combined with the analog input signal at an input of the low pass filter element,
   wherein a transconductance of the quantizer and the digital to analog converter corresponds to a ratio of (i) a maximum current input to the digital to analog converter to (ii) a maximum voltage swing at an input of the quantizer.

8. The analog to digital converter of claim 7, wherein
   the digital to analog converter includes a plurality of cells, and
   the digital to analog converter is configured to individually activate or deactivate, based on the digital output signal, selected ones of the plurality of cells to inject or absorb, respectively, the current associated with the feedback path.

9. The analog to digital converter of claim 7, wherein the quantizer comprises a multi-feedback second order sigma-delta modulator.

10. A wireless receiver comprising the analog to digital converter of claim 7.

11. The analog to digital converter of claim 7, wherein the noise associated with the feedback path is proportional to a voltage of the analog output signal.

12. The analog to digital converter of claim 7, further comprising an integrator configured to generate the analog output signal based on the filtered analog input signal.

13. The analog to digital converter of claim 12, wherein the integrator comprises
   an operational amplifier configured to (i) receive the filtered analog input signal, and (ii) generate the analog output signal, and
   a capacitive feedback path connecting an output of the operational amplifier to an input of the operational amplifier.

14. The analog to digital converter of claim 13, wherein the integrator comprises an input resistor connected between the input of the operational amplifier and an output of the low pass filter element.

15. The analog to digital converter of claim 7, wherein the low pass filter element is configured to attenuate frequencies of the analog input signal that are greater than a predetermined frequency.

* * * * *